United States Patent [19]

Manos, II et al.

[11] Patent Number: 4,982,250

[45] Date of Patent: Jan. 1, 1991

[54] MOSTURE BARRIER FOR FLOATING GATE TRANSISTORS

[75] Inventors: Peter N. Manos, II; Roger S. Countryman, Jr., both of Austin, Tex.

[73] Assignee: Motorola, Inc., Schaumburg, Ill.

[21] Appl. No.: 293,410

[22] Filed: Jan. 4, 1989

[51] Int. Cl.⁵ ............................................. H01L 29/78
[52] U.S. Cl. .................... 357/23.5; 357/23.9; 357/23.11; 357/52; 357/54; 357/59
[58] Field of Search .................. 357/23.5, 23.9, 52, 357/54, 59, 23.11

[56] References Cited

U.S. PATENT DOCUMENTS 4,581,622  4/1986  Takasaki et al. ............... 357/23.5
4,668,973  5/1987  Dawson et al. ............... 357/23.9
4,686,000  8/1987  Heath ............................ 357/23.9

Primary Examiner—Edward J. Wojciechowicz
Attorney, Agent, or Firm—James L. Clingan, Jr.

[57] ABSTRACT

A floating gate device has a control gate and a floating gate. The floating gate is for charging to set a logic state therein. Moisture is a problem in causing the floating gate to either lose its charge or becoming charged to the wrong state. A thin nitride layer deposited over the control gate and along the sides of the floating gate and control gate as a moisture barrier. This nitride layer is sufficiently thin so as to provide only insignificant attenuation of ultra-violet light used to neutralize the charge state of the floating gate. This nitride layer is not used as a passivation layer so that the desirable phoshosilicate glass (PSG) can be used for passivation.

5 Claims, 4 Drawing Sheets

MOSTURE BARRIER FOR FLOATING GATE TRANSISTORS

FIELD OF THE INVENTION

The invention relates to non-volatile memory devices, and more particularly, to MOS floating gate transistors device structures.

BACKGROUND OF THE INVENTION

In floating gate EPROMs, one of the historic areas of concern has been data retention. In MOS transistors, the most common type of passivation that has been used is phosphosilicate glass (PSG) which has been used on EPROMs. The PSG has been found to lead to data loss due to moisture penetration. If the EPROM is in a ceramic package, which is hermetically sealed, the problem is lessened. The problem is greater in a plastic package, which is not hermetically sealed, than in ceramic. Similarly, the problem is more severe for devices which are not packaged, eg. left in wafer form, than for ones in plastic packages. The use of a nitride passivation has been found to improve the data retention, presumably because it is a better barrier to moisture than PSG. Nitride as passivation, however, creates other problems. Typical nitride absorbs ultra-violet (UV) radiation. The UV radiation, which is required to erase EPROMs, does not effectively penetrate this type of passivation which is quite thick, for example, 3000 Angstroms. This type of nitride passivation is relatively effective for one time programmable (OTP) ROMs. There is also a type of a UV-transparent nitride and there is oxynitride which have been used to benefit. All of these, however, also have problems with stress-induced metal voids which is not a problem with PSG.

SUMMARY OF THE INVENTION

Accordingly, it is an object of the present invention to provide an improved MOS floating gate transistor structure.

It is another object of the present invention to provide an EPROM cell with improved data retention.

It is yet another object of the invention to provide a method for making an improved EPROM cell.

In carrying out these and other objects of the invention, there is provided, in one form, a device structure of a transistor in an active region of a semiconductor substrate. The device structure has a first layer of polysilicon, a first insulator layer, a second insulator layer, a second layer of polysilicon, a layer of nitride, a third insulator, and a metal layer. The first layer of polysilicon covers an intermediate portion of the active region leaving first and second uncovered portions of the active region on opposite sides of the first layer. The first insulator layer is between the first layer and the active region the second insulator layer is over the first layer of polysilicon. The second layer of polysilicon is over and substantially coterminous with the first layer of polysilicon over the active region. The layer of nitride is over the second layer of polysilicon and at least portions of the first and second uncovered portions of the active region. The third insulator layer is over the layer of nitride and the semiconductor substrate outside the active region. The metal layer is over at least portions of the third insulator layer which are over the semiconductor substrate outside the active region.

DETAILED DESCRIPTION OF THE INVENTION

Figure 1:
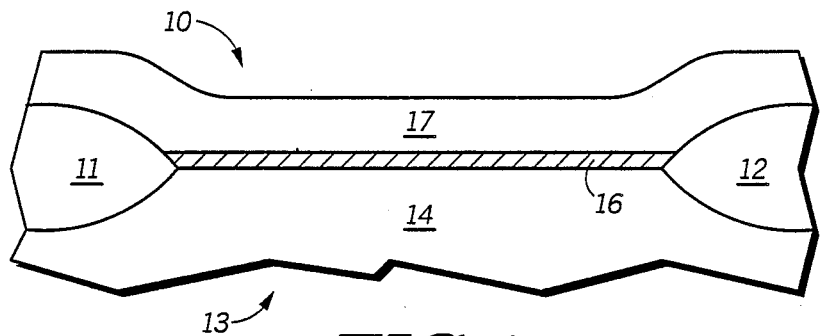
FIG. 1 is a cross-section of a portion of a substrate at a stage in processing according to the prior art preliminary to stages in processing according to the preferred embodiment of the invention.
Figure 2:
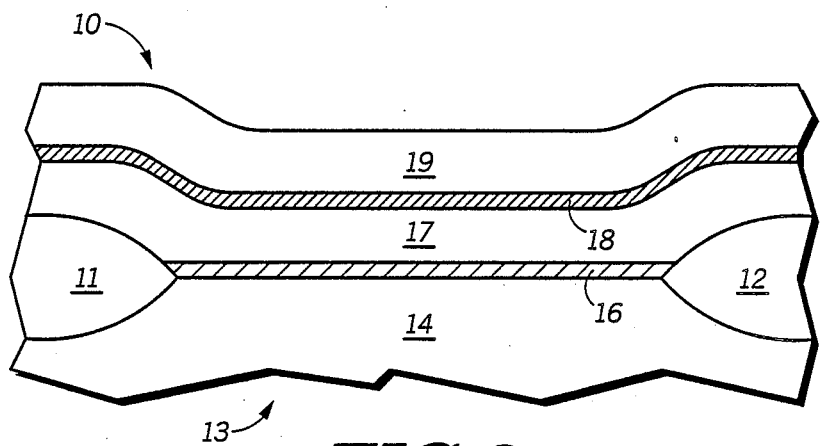
FIG. 2 is a cross-section of a portion of the substrate of FIG. 1 at a stage in processing according to the prior art subsequent to that of FIG. 1 and preliminary to the stages in processing according to the preferred embodiment of the invention.
Figure 3:
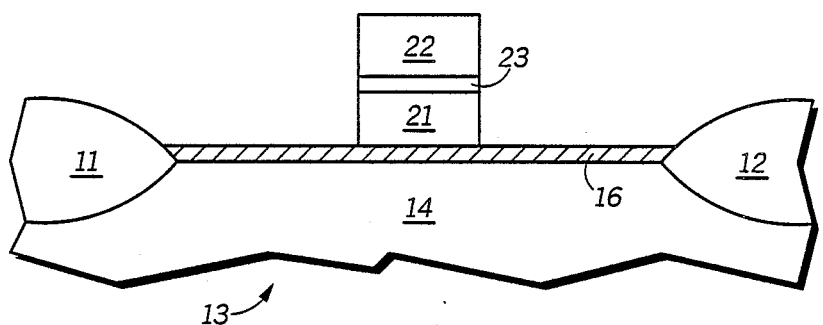
FIG. 3 is a cross-section of a portion of the substrate of FIG. 1 at a stage in processing according to the prior art subsequent to that of FIG. 2 and preliminary to the stages in processing according to the preferred embodiment of the invention.
Figure 4:
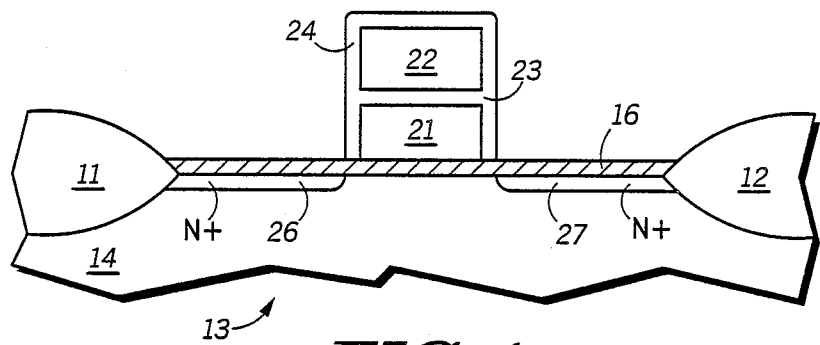
FIG. 4 is a cross-section of a portion of the substrate of FIG. 1 at a stage in processing according to the prior art subsequent to that of FIG. 3 and preliminary to the stages in processing according to the preferred embodiment of the invention.

Shown in FIG. 1 is a portion 10 of an integrated circuit comprising field oxide portions 11 and 12 with an active region 13 therebetween formed in a substrate 14, an oxide layer 16 formed over substrate 14 in active region 13, a first layer of polysilicon 17 deposited to overlie oxide layer 16 over active region 13 and overlie field oxide portions 11 and 12. The structure of FIG. 1 is formed by a conventional process in which oxide layer is formed after active region 13 is defined by field oxide portions 11 and 12. First layer of polysilicon 17 is then formed. Shown in FIG. 2 is portion 10 after an insulator layer 18 is formed over first layer of polysilicon 17 and second layer of polysilicon 19 is formed over insulator layer 18. Shown in FIG. 3 is portion 10 after first and second layers of polysilicon 17 and 19 have been selectively etched leaving a polysilicon floating gate 21 formed as an unetched portion of first layer of polysilicon 17, a control gate 22 formed as an unetched portion of second layer of polysilicon 19, and an insulator 23 remaining between floating gate 21 and control gate 22. This etch leaves floating gate 21 and control gate coterminous at least over active region 13. This etch uncovers portions of substrate 14 on both sides of control and floating gates 21 and 22. Shown in FIG. 4 is portion 10 after a reoxidation step and a lightly-doped drain (LDD) implant and an array implant. The memory devices must have heavily doped sources and drains. Peripheral circuits use LDD transistors. One of the purposes of LDD techniques is to reduce hot electron injection which is the very characteristic that is desirable for programming a floating gate transistor EPROM cell. The reoxidation results in an oxide layer 24 on the top of control gate 22 and on the sides of control gate 22 and floating gate 21. The LDD implant and array implant results in a heavily-doped drain 26 and a heavily-doped source 27 in the uncovered portions of active region 13. The structures of FIGS. 1–4 and the processes for obtaining them are in the prior art.

Figure 5:
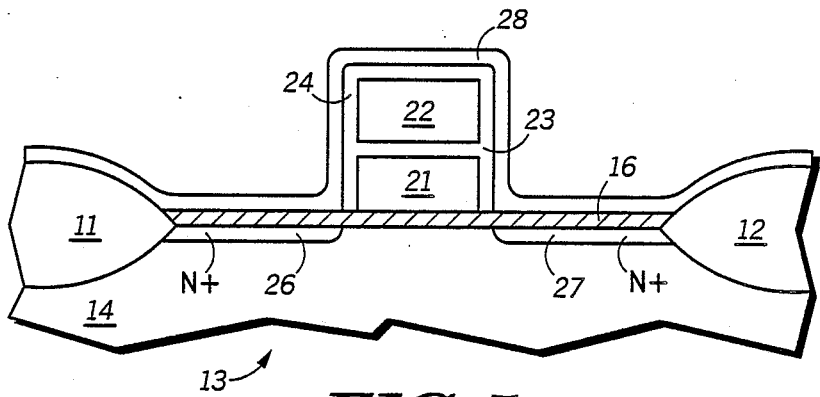
FIG. 5 is a cross-section of a portion of the substrate of FIG. 1 at a stage in processing subsequent to that of FIG. 4 and according to one of the stages in processing according to the preferred embodiment of the invention.
Figure 6:
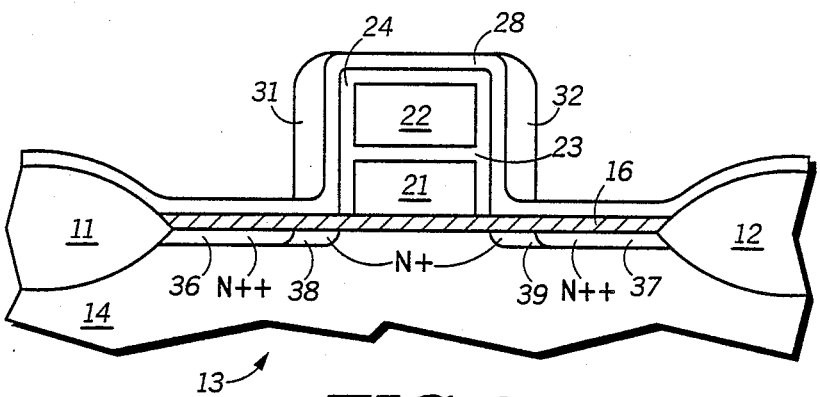
FIG. 6 is a cross-section of a portion of the substrate of FIG. 1 at a stage in processing subsequent to that of FIG. 5 and according to one of the stages in processing according to the preferred embodiment of the invention.
Figure 7:
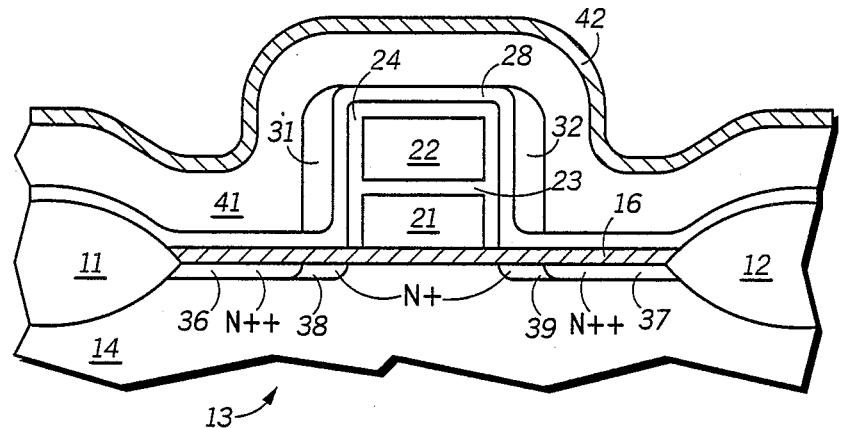
FIG. 7 is a cross-section of a portion of the substrate of FIG. 1 at a stage in processing subsequent to that of FIG. 6 and according to one of the stages in processing according to the preferred embodiment of the invention.
Figure 8:
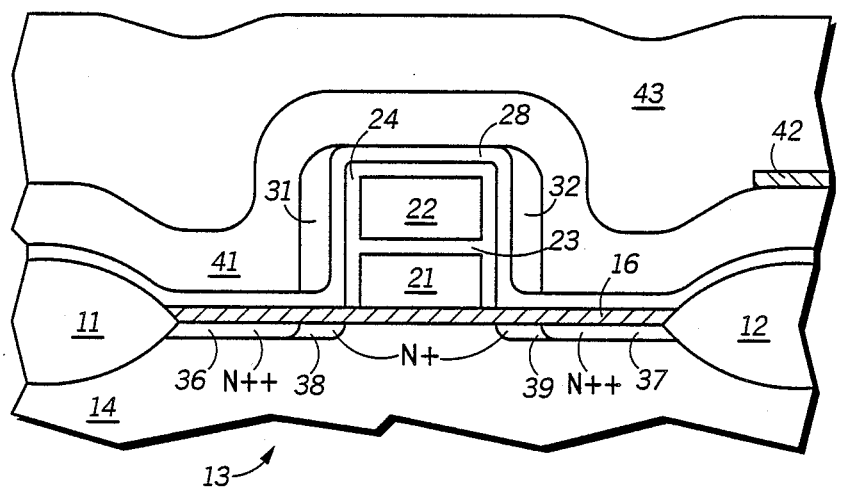
FIG. 8 is a cross-section of a portion of the substrate of FIG. 1 at a stage in processing subsequent to that of FIG. 7 and according to one of the stages in processing according to the preferred embodiment of the invention.

Shown in FIG. 5 is portion 10 after a thin layer of nitride 28 has been deposited over portion 10 so that active region 13 and field oxide regions 11 and 12 are covered. Thus, nitride layer 28 is over control gate 22 and along the sides of floating and control gates 21 and 22 as well as covering the uncovered portions of active region 13. Nitride layer 28 is formed using low pressure chemical vapor deposition (LPCVD) which is a well known process for forming nitride layers. Nitride layer 28 is only about 200 Angstroms thick which provides only insignificant attenuation of UV which is used to cause floating gate 21 to become neutral in charge. Nitride layer 28 is much more impervious to moisture penetration than is oxide. Thus, the barrier to moisture in the presence of portion 10 will be significantly increased due to nitride layer 28. Nitride layer 28 is not in contact with any polysilicon which avoids some problems which can occur when nitride is contact with polysilicon in a finished integrated circuit. Nitride is of course commonly used in integrated circuits but not commonly in situations where the nitride is left on a finished integrated circuit in contact with silicon, whether monocrystalline silicon or polysilicon. Shown in FIG. 6 is portion 10 after formation of sidewall spacers 31 and 32 along the sides of floating and control gates 21 and 22 and a heavy N-type implant. Sidewall spacers 31 and 32 are separated from floating and control gates 21 and 22 by oxide layer 24 and nitride layer 28. The implant, in which sidewall spacers 31 and 32 act as a mask, results in heavily doped regions 36 and 37 in the portion of active region 13 not covered by floating and control gates 21 and 22 and sidewall spacers 31 and 32 and lightly doped regions under sidewall spacers 31 and 32. The sidewall spacers are not critical to the EPROM cell but occur as part of the normal processing in the periphery. FIG. 7 shows portion 10 after deposition of a thick oxide layer 41 and a metal layer 42 in which oxide layer 41 separates metal layer 42 from nitride layer 28. Prior to depositing metal layer 42, areas where metal is to contact substrate are etched so that upon deposition of metal layer 42 there will be a metal contact to the substrate at those contact areas. Metal layer 42 is itself selectively etched. In the preferred embodiment, metal is at least etched in the area which is over floating and control gates 21 and 22. This allows the UV to penetrate to floating gate 21. This is shown in FIG. 8 with a metal portion 42 remaining but not over floating gate 21. After metal has been etched, a passivation layer 43 of PSG is applied.

The structure shown in FIG. 8 is an improvement over the prior art by having thin nitride layer 28 provide a moisture barrier while not providing excessive attenuation of the UV. The nitride is also not in contact with silicon which is generally considered desirable.

Figure 9:
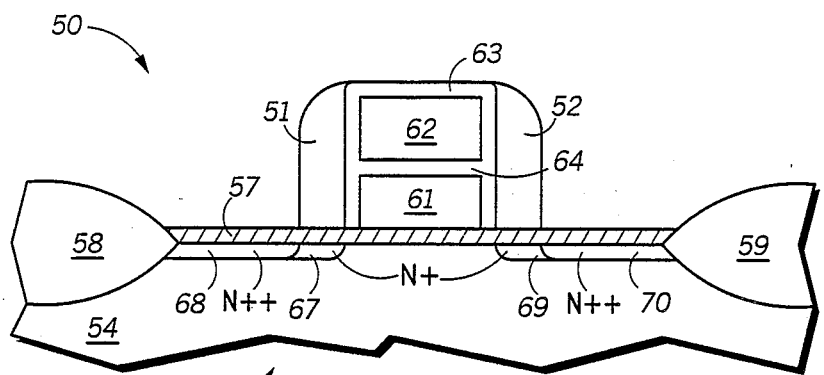
FIG. 9 is a cross-section of a portion of a substrate analogous to the substrate of FIG. 1 at a stage in processing subsequent to that of a structure analogous to that of FIG. 4 according to the prior art and preliminary to one of the stages in processing according to the preferred embodiment of the invention.
Figure 10:
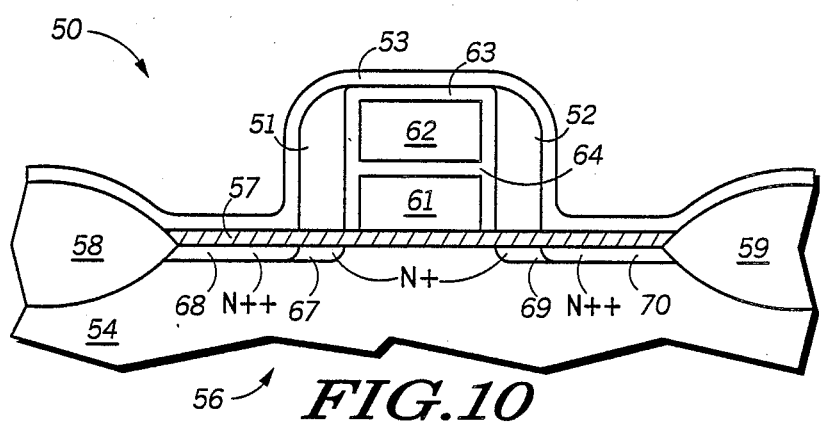
FIG. 10 is a cross-section of the structure of FIG. 9 at a subsequent stage in processing to that of FIG. 9 according to one of the stages in processing according to the preferred embodiment of the invention.
Figure 11:
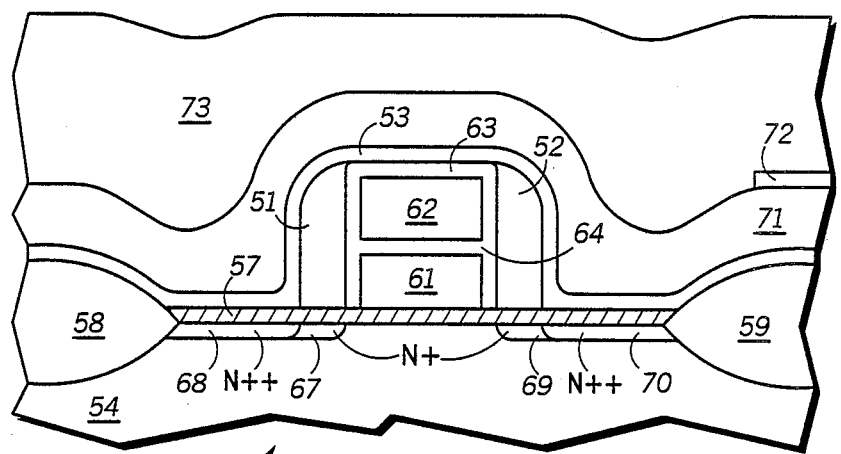
FIG. 11 is a cross-section of the structure of FIG. 10 at a subsequent stage in processing to that of FIG. 10 according to one of the stages in processing according to the preferred embodiment of the invention.

A similar structure with similar advantages can be obtained by forming the sidewall spacers before the nitride layer is deposited. In such a case, the process could be the same as described for FIGS. 1–4. Shown in FIG. 9 is a portion 50 of an integrated circuit similar to that of portion 10 but in which sidewall spacers 51 and 52 are formed before a nitride layer 53 is formed. Analogous to portion 10, there is a substrate 54, an active region 56, an oxide layer 57 formed on substrate 54, field oxide regions 58 and 59 defining active region 56, a floating gate 61, a control gate 62, an oxide layer 63 coating the top of control gate 62 and the sides of floating and control gates 61 and 62, and an insulator 64 between floating gate 61 and control gate 62. Also analogous to portion 10 is an N+ drain portion 67, an N++ drain portion, an N+ source portion 69, and an N++ source portion 70. Nitride layer 53 is shown in FIG. 10. Nitride layer 53 in FIG. 10 is formed after sidewall spacers 51 and 52 are formed and after the heavy N-type implant which forms N++ drain and source portions 68 and 70. Thus, this implant does not have to penetrate nitride layer 63. After nitride layer 53 is deposited, as for portion 10, an oxide layer 71 as shown in FIG. 11 is formed. A metal layer is deposited over oxide layer 71. Prior to the metal layer being deposited, oxide layer 71, nitride layer 63, and oxide layer 66 are selectively etched in areas where metal is to contact substrate 54 generally at an N++ region. The metal layer is etched leaving unetched portions of metal such as an unetched portion of metal 72 shown in FIG. 11. After the metal etch a passivation layer 73 of PSG is deposited as shown in FIG. 11.

Thus, it is shown that a nitride layer over the polysilicon control gate can be implemented to provide an improved barrier to moisture penetration. This nitride layer is at least over the top of the control gate and along the sides of the control gate and floating gate. By being along the sides of the control gate and floating gate, the nitride layer is over a portion of the uncovered portion of the active region which is adjacent to the control gate and floating gate. The nitride layer is made thin so as not to attenuate the UV and is not used for passivation so that the desirable PSG can be used for passivation. Two embodiments have been shown. Both embodiments are for use in a LDD process in which sidewall spacers are formed. One embodiment is for forming the nitride layer before the sidewall spacers are formed and the other is for forming the nitride layer after the sidewall spacers are formed. The use of the nitride layer as an improved barrier, however, is not limited to LDD processes. There have been techniques developed in which the floating gate is etched prior to the deposition of the second polysilicon layer which is etched to form the control gate. In those cases the control gate is not coterminous with the floating gate over the active region. A thin layer of nitride could still be used in such a case to provide an improved moisture barrier.

While the invention has been described in specific embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A device structure of a transistor in an active region of a semiconductor substrate at a stage in processing, the active region being bounded by a field oxide in the substrate, comprising:
   a first layer of polysilicon covering an intermediate portion of the active region leaving first and second uncovered portions of the active region on opposite sides of the first layer;
   a first insulator layer between the first layer and the active region;
   a second insulator layer over the first layer of polysilicon;
   a second layer of polysilicon over and substantially coterminous with the first layer of polysilicon over the active region;
   a layer of nitride over substantially all of the active region, said layer of nitride being not greater than about 200 Angstroms thick; and
   a third insulator layer over the layer of nitride and the semiconductor substrate outside the active region.

2. The device structure of claim 1 wherein the first and second layers of polysilicon have first and second sides, said device structure further comprising:
   a first sidewall spacer having a vertical dimension and a horizontal dimension and adjacent to the first side of the first and second layers of polysilicon and covering a portion of the first uncovered portion of the active region, said first sidewall spacer being of a material and of such vertical dimension to prevent implanted ions from reaching said portion of the active region covered by the first sidewall spacer; and
   a second sidewall spacer having a vertical dimension and a horizontal dimension and adjacent to the second side of the first and second layers of polysilicon and covering a portion of the second uncovered portion of the active region, said second sidewall spacer being of a material and of such vertical dimension to prevent implanted ions from reaching said portion of the active region covered by the second sidewall spacer.

3. The device structure of claim 2 wherein:
   the first sidewall spacer is between the first side of the first and second layers and the nitride layer; and
   the second sidewall spacer is between the second side of the first and second layers and the nitride layer.

4. The device structure of claim 2 wherein:
   a first portion of the nitride layer is between the first sidewall spacer and the first side of the first and second layers of polysilicon; and
   a second portion of the nitride layer is between the second sidewall spacer and the second side of the first and second layers of polysilicon.

5. A floating gate transistor for use as a memory cell in a memory which is erased using ultra-violet light, said floating gate transistor formed in an active region of a substrate bounded by field oxide, comprising:
   a first layer of polysilicon covering an intermediate portion of the active region leaving first and second uncovered portions of the active region on opposite sides of the first layer, said first layer of polysilicon being a floating gate of the floating gate transistor;
   a first doped region in the first uncovered portion of the active region, said first doped region being a drain of the floating gate transistor;
   a second doped region in the second uncovered portion of the active region, said second doped region being a source of the floating gate transistor;
   a first insulator layer between the first layer and the active region;
   a second insulator layer over the first layer of polysilicon;
   a second layer of polysilicon over and substantially coterminous with the first layer of polysilicon over the active region, said second layer of polysilicon being a control gate of the floating gate transistor;
   a layer of nitride over substantially all of the active region, said layer of nitride being not greater than about 200 Angstroms thick; and
   a third insulator layer over the layer of nitride and the semiconductor substrate outside the active region.

* * * * *